US010749473B2

(12) United States Patent
Bellaouar et al.

(10) Patent No.: US 10,749,473 B2
(45) Date of Patent: Aug. 18, 2020

(54) METHODS, APPARATUS, AND SYSTEM FOR A FREQUENCY DOUBLER FOR A MILLIMETER WAVE DEVICE

(71) Applicant: GLOBALFOUNDRIES INC., Grand Cayman (KY)

(72) Inventors: Abdellatif Bellaouar, Richardson, TX (US); Arul Balasubramaniyan, Plano, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 127 days.

(21) Appl. No.: 15/966,747

(22) Filed: Apr. 30, 2018

(65) Prior Publication Data

US 2020/0028499 A1    Jan. 23, 2020

Related U.S. Application Data

(60) Provisional application No. 62/608,491, filed on Dec. 20, 2017.

(51) Int. Cl.
| | |
|---|---|
| H03B 19/00 | (2006.01) |
| H03B 19/06 | (2006.01) |
| H03B 19/10 | (2006.01) |
| H03B 19/14 | (2006.01) |
| H03K 5/00 | (2006.01) |

(52) U.S. Cl.
CPC ............. *H03B 19/00* (2013.01); *H03B 19/06* (2013.01); *H03B 19/10* (2013.01); *H03B 19/14* (2013.01); *H03K 5/00006* (2013.01)

(58) Field of Classification Search
CPC ........ H03B 19/00; H03B 19/06; H03B 19/10; H03B 19/14; H03K 5/00006
See application file for complete search history.

(56) References Cited

U.S. PATENT DOCUMENTS

| | | | | |
|---|---|---|---|---|
| 5,097,347 A | * | 3/1992 | Wedam .................. | H04N 9/898 386/269 |
| 6,026,126 A | * | 2/2000 | Gaetano .............. | H04L 25/4902 330/10 |
| 6,211,708 B1 | * | 4/2001 | Klemmer ............... | H03B 21/01 327/122 |

(Continued)

*Primary Examiner* — Patrick C Chen
(74) *Attorney, Agent, or Firm* — Williams Morgan, P.C.

(57) ABSTRACT

An apparatus for performing a frequency multiplication of an mm-wave wave signal is provided. The apparatus includes a first differential circuit that is capable of receiving a 0° phase component of an input signal and a 180° phase component of the input signal having a first frequency. The first differential circuit provides a first output signal that is twice the frequency and is in –phase(0°) based on the 0° the 180° phase components of the input signal. The apparatus also includes a second differential circuit that is capable of receiving a 90° phase component of the input signal and a 270° phase component of the input signal, and provide a first output signal that is twice the frequency and out of phase (180°). The apparatus also includes a differential transformer that is configured to receive the first output signal and the second output signal. The differential transformer is configured to provide a differential output signal that has a second frequency that is twice the first frequency.

17 Claims, 12 Drawing Sheets

(56) References Cited

U.S. PATENT DOCUMENTS

| | | | |
|---|---|---|---|
| 8,258,827 B2* | 9/2012 | Chang | H03B 19/14 |
| | | | 327/116 |
| 2012/0092121 A1* | 4/2012 | Jin | H01L 23/5227 |
| | | | 336/232 |
| 2015/0349782 A1* | 12/2015 | Pai | H03L 7/081 |
| | | | 327/117 |
| 2017/0105659 A1* | 4/2017 | Kiaei | A61B 5/0507 |
| 2018/0267144 A1* | 9/2018 | Lin | G01S 7/285 |

* cited by examiner

METHODS, APPARATUS, AND SYSTEM FOR A FREQUENCY DOUBLER FOR A MILLIMETER WAVE DEVICE

BACKGROUND OF THE INVENTION

Field of the Invention

Generally, the present disclosure relates to the manufacture of sophisticated semiconductor devices, and, more specifically, to various methods and systems for providing a frequency doubler for a radar device.

Description of the Related Art

The technology explosion in the manufacturing industry has resulted in many new and innovative products manufacturing processes. The so-called millimeter wave (mm-wave) applications include devices that operate based on the electromagnetic spectrum of radio band frequencies in the range of about 30 Gigahertz (GHz) to about 300 GHz. The mm-wave radio waves have a wavelength in the range of 1 millimeter (mm) to about 10 mm, which corresponds to a radio frequency of 30 GHz to about 300 GHz. This band of frequencies is sometimes referred to as extremely high frequency (EHF) frequency band range. Examples of applications of mm-wave application include radar devices, high-speed communication devices (e.g., wireless gigabit (Wi-Gig) devices), etc. Radar devices have been implemented in various applications such as vehicle safety and automation applications.

Implementing mm-wave applications produces many challenges when designing circuits for these applications. Generally mm-wave applications require the use of a signal generator that produces a very high-frequency signal, which is often doubled to provide the desired frequency within the mm-wave range. Due to power consumption and other electrical complications that result from using signals that have frequencies in the range of the mm-wave frequency band, designers often start with lower-frequency signals and then double the signal. In order to provide a signal of sufficient frequency, designers have implemented so-called frequency doublers, i.e., circuits that are designed to receive a lower-frequency signal, and then double that signal to provide a signal that has a frequency in the mm-wave band.

The state of the art frequency doublers have various problems. For example, typical frequency doublers use differential circuits that terminate into a single ended output. Often, the single ended output is electrically coupled to a transformer to provide a differential output. This process has various inefficiencies, such as excessive power consumption, relatively low gain, noise that can result in errors, etc. Additional circuitry, such as gain amplifies, filters, etc., are then implemented to address those problems. However, these solutions themselves comprise various problems, such as usage of circuit real estate, power consumption, etc. Often, the state of the art solutions require the implementation of signal generators on a chip that is separate from the chip that houses the mm-wave implementation.

The present disclosure may address and/or at least reduce one or more of the problems identified above.

SUMMARY OF THE INVENTION

The following presents a simplified summary of the disclosure in order to provide a basic understanding of some aspects of the disclosure. This summary is not an exhaustive overview of the disclosure. It is not intended to identify key or critical elements of the disclosure or to delineate the scope of the disclosure. Its sole purpose is to present some concepts in a simplified form as a prelude to the more detailed description that is discussed later.

An apparatus for performing a frequency multiplication of a millimeter wave (mm-wave) signal is provided by embodiments herein. The apparatus includes a first differential circuit that is capable of receiving a 0° phase component of an input signal at a first input of the first differential circuit and a 180° phase component of the input signal at a second input of the first differential circuit. The first differential circuit provides a first output signal based on the 0° and the 180° phase components of the input signal. The apparatus also includes a second differential circuit that is capable of receiving a 90° phase component of the input signal at a first input of the second differential circuit and a 270° phase component of the input signal at a second input of the second differential circuit, and provide an first output signal based on the 90° and the 270° phase components of the input signal. The input signal has a first frequency. The apparatus also includes a differential transformer that is configured to receive the first output signal at a first node and receive the second output signal at a second node. The differential transformer is configured to provide a differential output signal that has a second frequency that is twice the first frequency.

BRIEF DESCRIPTION OF THE DRAWINGS

The disclosure may be understood by reference to the following description taken in conjunction with the accompanying drawings, in which like reference numerals identify like elements, and in which.

Figure 1:
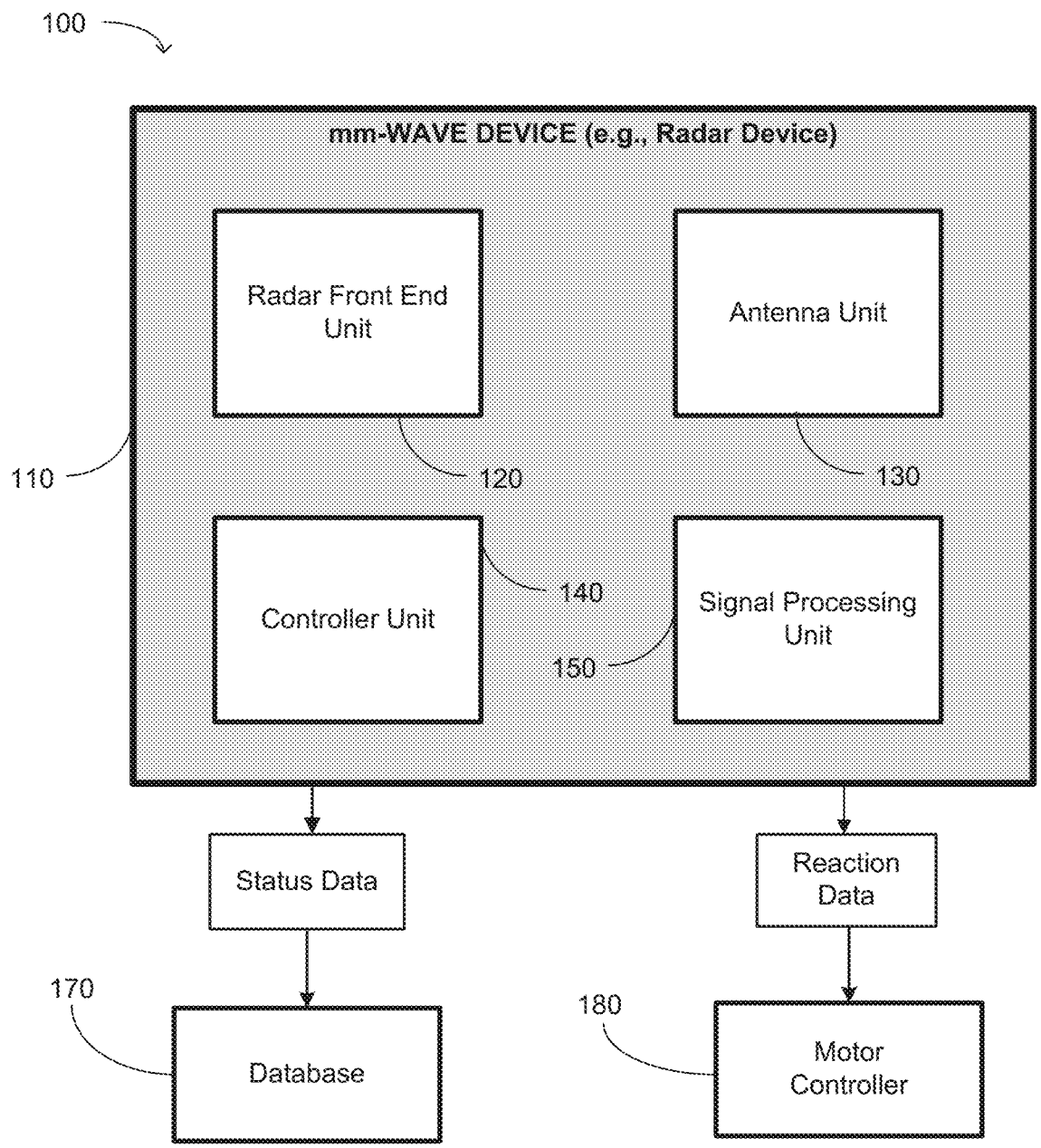
FIG. 1 illustrates a stylized block diagram representation of a radar system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

Various illustrative embodiments of the disclosure are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for a differential frequency doubler (FD) circuit capable of performing doubling of the frequency of an input signal. The circuit of embodiments herein may be a fully differential circuit. Embodiments herein provide a quadrature FD circuit that provides a fully differential output signal. The fully differential FD circuit of embodiments herein is capable of providing a large amplitude swing. Further, the fully differential FD circuit of embodiments herein is capable of providing improved RF isolation from other circuits of a communication device. The FD circuit of embodiments herein may be implemented as a true differential, push-push configuration FD circuit.

For ease of illustration, embodiments herein is depicted within the context of a radar device, however, those skilled in the art would readily appreciate that the concepts disclosed herein may be implemented in other types of devices, such as high-speed communication devices, network devices, etc. Turning now to FIG. 1, a stylized block diagram representation of a radar system, in accordance with embodiments herein, is illustrated.

A system 100 may comprise an mm-wave device 110, a database 170, and a motor controller 180. The mm-wave device 110 may be a radar device, a wireless communication device, a data network device, a video device, or the like. For illustrative purposes and for the sake of clarity and ease of description, the mm-wave device 110 is described in the context of a radar application, as such; the mm-wave device 110 may be often referred to below as a radar device 110. However, those skilled in the art having benefit of the present disclosure would appreciate that the concepts described herein may be applied to a variety of type of mm-wave applications, including vehicle applications using radar signals, wireless network applications, data network application, video and audio applications, etc.

The radar device 110 is capable of transmitting a radar signal, receiving a reflected signal resultant from the reflection of the radar signal, processing the reflected signal, and providing status data and/or reaction data for performing one or more actions based on the reflected signal. In one embodiment, the status data may include status of the target from which the reflection was received. Further, a motor controller 180 may perform control operations of one or more motors. Examples of motors may include devices that performing braking functions, steering functions, gear-shifting functions, accelerating functions, warning functions, and/or other actions relating to the operations of a road vehicle, an aircraft, and/or a water motor craft. The motor controller 180 may use the reaction data and/or the status data to perform these control functions. The motor controller 180 may comprise one or more controllers that are capable of controlling a plurality of devices that perform the various operations of a road vehicle, an aircraft, and/or a water motor craft.

The radar device 110 may comprise a radar front-end unit 120, an antenna unit 130, a controller unit 140, and a signal processing unit 150. The radar front-end unit 120 may comprise a plurality of components, circuit, and/or modules, and is capable of sending, receiving, processing, and reacting to radar signals. In one embodiment, the radar device 110 may be encompassed into a single integrated circuit (IC) chip. In some embodiments, the radar device 110 may be formed on a plurality of integrated circuits that are positioned on a single IC chip. In other embodiments, radar device 110 may be formed on single integrated circuit, which is shrouded into an IC chip. In some cases, the radar front-end unit 120 may be referred simply as a radar unit 120.

The radar front-end unit 120 is capable of providing a radar signal. In one embodiment, the frequency range of the radar signals processed by the radar device 110 may be in the range of about 10 GHz to about 90 GHz. The radar front-end unit 120 is capable of generating a radar signal at a predetermined frequency range and directing the radar signal at a predetermined target area. The radar front end unit 120 is also capable of receiving a reflected signal based on the reflection of radar signal, and processing the reflected signal to determine a plurality of characteristics, such as the direction of a target, the speed of a target, the relative distance of a target, and/or the like. A more detailed description of the radar front-end unit 120 is provided in FIG. 3 and accompanying description below.

In an alternative embodiment, the 120 may be a network communications front-end unit, instead of a radar front-end unit. In this embodiment, instead of receiving, transmitting, and/or processing network signals, the device 110 may process network communications for various types of communication applications, such as packet data network communications, wireless (e.g., cellular communications, IEEE 802.11ad WiGig Technology, etc.), data communications, etc. The concepts disclosed herein in the context of radar applications may also be utilized for other types of applications, such as network communications, wireless communications, high-definition video, etc.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the radar signal, while the receiver antennas are used for receiving reflected signals resulting from reflections of the radar signal. A more detailed description of the antenna unit 130 is provided in FIG. 7, and accompanying description below.

Continuing referring to FIG. 1, the radar device 110 may also comprise a signal processing unit 150. The signal processing unit 150 is capable of performing various analog and/or digital processing of the signals that are transmitted and/or received by the radar device 110. For example, a radar signal transmitted by the radar device may be amplified prior to its transmission. Further, the reflected signal received by the radar device 110 may be sent through one or more analog filter stages. The reflected signals may then be converted to a digital signal by one or more analog-to-digital converters (DAC) in the signal processing unit 150. Digital signal processing (DSP) may be performed on the digitized signal. A more detailed description of the signal processing unit 150 is provided in FIG. 6 and accompanying description below.

Continuing referring to FIG. 1, the radar device 100 may also comprise a controller unit 140. The controller unit 140 may perform various control operations of the radar device 110. These functions include generating a radar signal, transmitting the radar signal, receiving a reflected signal, processing the reflected signal, and perform one or more determination of the location, direction, speed, etc. of a target based on the reflected signal. The controller unit 140 is capable of generating the status data and the reaction data described above.

Figure 2:
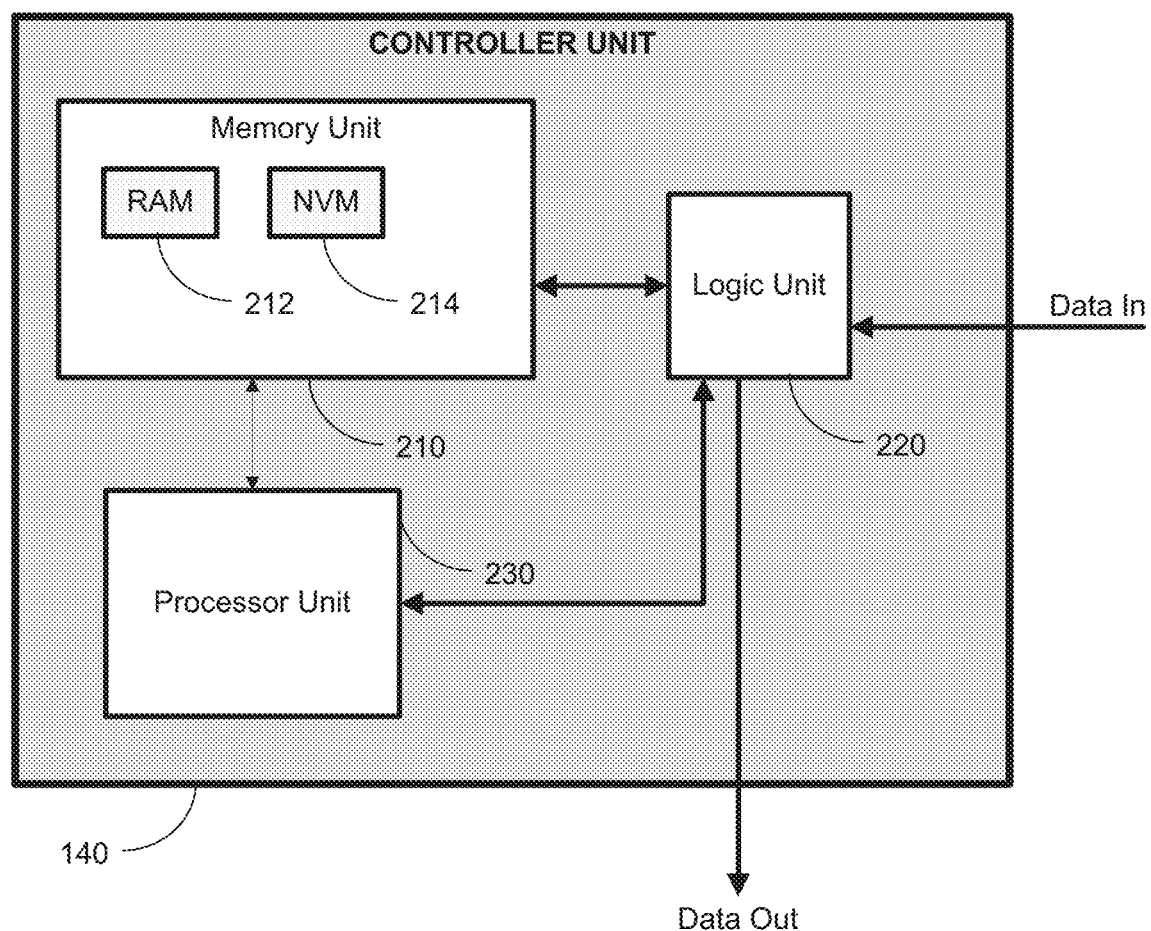
FIG. 2 illustrates Turning now to FIG. 2, a stylized block diagram description of the controller unit 140, in accordance with embodiments herein.

Turning now to FIG. 2, a stylized block diagram description of the controller unit 140, in accordance with embodiments herein, is provided. The controller unit 140 may comprise a processor unit 230 capable of controlling various function of the radar device 110. The processor unit 230 may comprise a microprocessor, a microcontroller, a field programmable gate array (FPGA), an application-specific integrated circuit (ASIC), and/or the like.

The controller unit 140 may also comprise a logic unit 220. The logic unit 220 may comprise a circuit that is capable of performing various logic operations, receiving data, performing interface functions with respect to input data (data_in) and output data (data_out). The signal data_in may represent data derived from processing and analyzing the reflected signal. The data_out signal may represent data generated for performing one or more tasks as a result of the radar signal transmission and the reflected signal. For example, the data_out signal may be used to perform an action based on the radar signal transmission and reflected signal reception.

The controller unit 140 may also comprise a memory unit 210. The memory unit 210 may comprise a non-volatile memory 214 and a RAM 212. The non-volatile memory 214 may comprise FLASH memory and/or programmable read only (PROM) devices. The memory unit 210 is capable of storing operation parameters for controlling operations of the radar device 110. Further, the memory unit 210 may store the status data and the reaction data described above. The memory unit 210 may also store data that may be used to program any FPGA devices in the radar device 110. As such, the memory unit 210 may be subdivided into a program data memory, a status data memory, reaction data memory. This subdivision may be performed logically, or physically.

Figure 3:
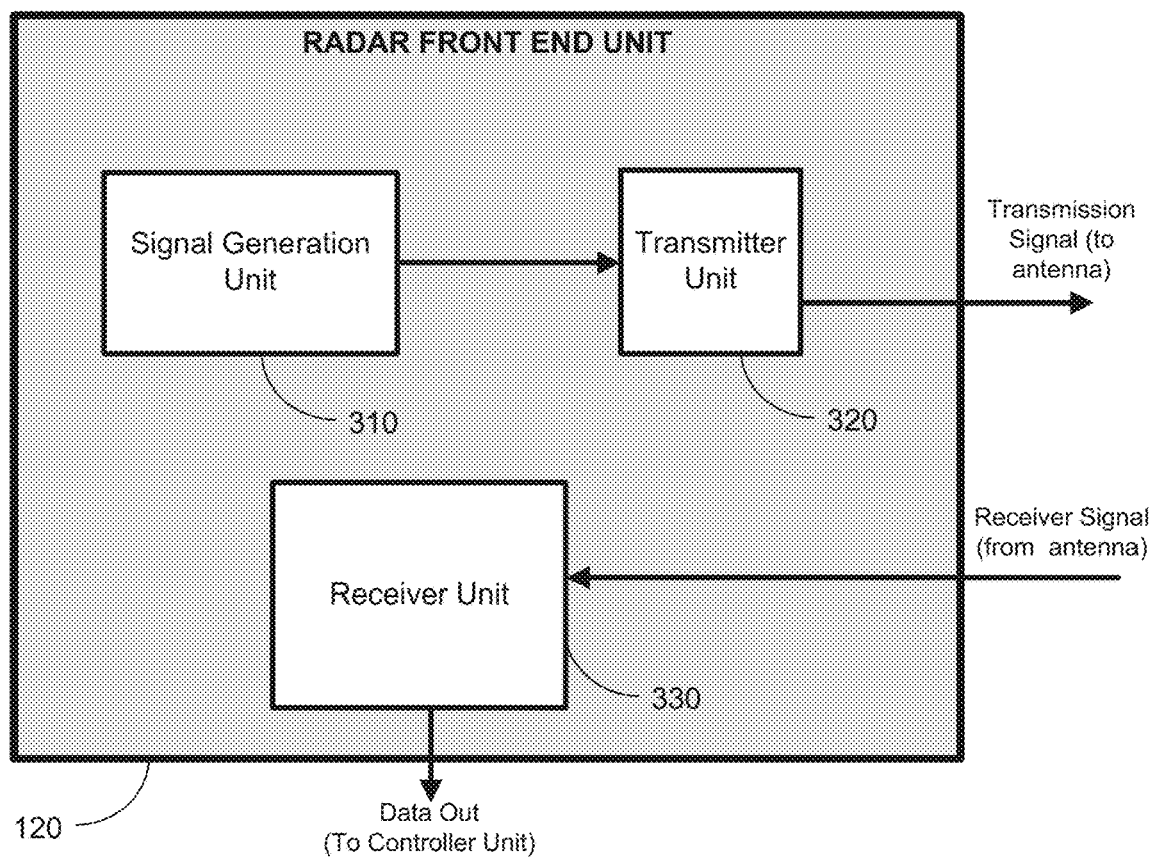
FIG. 3 illustrates a stylized block diagram depiction of the radar front end unit of FIG. 1, in accordance with embodiments herein, is illustrated.

Turning now to FIG. 3, a stylized block diagram depiction of the radar front-end unit 120, in accordance with embodiments herein, is illustrated. The radar front-end unit 120 may comprise a signal generation unit 310, a transmitter unit 320, a signal processing unit 340, and a receiver unit 330. The signal generation unit 310 is capable of generating a radar signal at a predetermined frequency. For example, a signal in the range of about 70 GHz to about 85 GHz may be generated. The signal generation unit 310 may comprise a true differential frequency doubler (FD). The FD may be formed in a push-push configuration. The signal generation unit 310 is capable of providing a radar signal for transmission. A more detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a radar signal, which is to be transmitted to the antenna unit 130.

Figure 4:
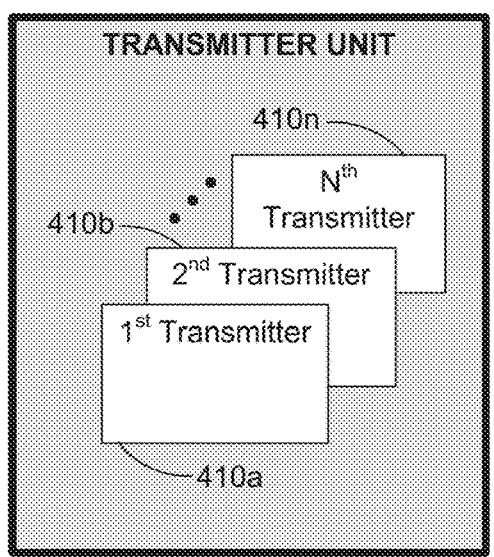
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a $1^{st}$ transmitter 410*a*, a $2^{nd}$ transmitter 420*b*, through an $N^{th}$ transmitter 410*n* (collectively "410"). In one embodiment, the $1^{st}$ through $N^{th}$ transmitters 410 may each process a single signal from the signal generation unit 310 and provide an output transmission signal to one or more antennas. In another embodiment, the signal generation unit 310 may provide a plurality of signals to the $1^{st}$ through $N^{th}$ transmitters 410. For example, the signal generation unit 310 may provide a signal transmit signal for each transmitter 410, or alternatively, a $1^{st}$ transmit signal for a first set of transmitters 410 and a $2^{nd}$ transmit signal for a second set of transmitters 410.

Continuing referring to FIG. 3, a received signal (i.e., reflected signal resulting from a reflection of the radar signal from a target) is provided to the receiver unit 330. The receiver unit 330 is capable of receiving the processed received signal from the signal processing unit 130. The receiver unit 330 is capable of performing analog-to-digital (A/D) conversion, signal buffering, DSP, etc. In some embodiments, the signal processing unit 130 may perform A/D conversions and DSP, however, in other embodiments, these tasks may be performed by the receiver unit 330. The receiver unit 330 is capable of directing to the controller unit 140.

Figure 5:
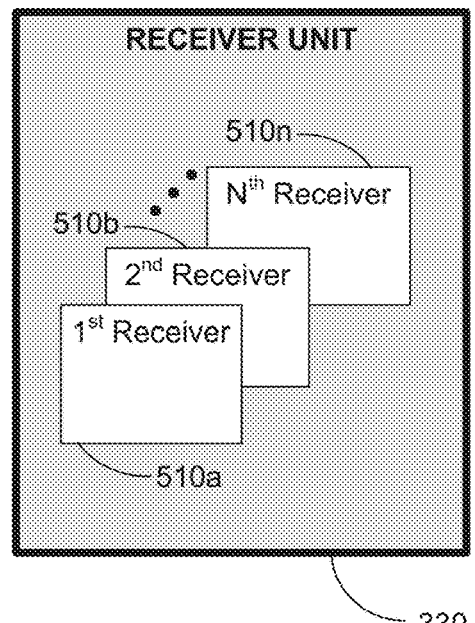
FIG. 5 illustrates a stylized block diagram of the receiver unit of FIG. 3, in accordance with embodiments herein.

FIG. 5 illustrates a stylized block diagram of the receiver unit 320, in accordance with embodiments herein. Referring simultaneously to FIGS. 3 and 5, the receiver unit 320 may comprise a plurality of similar receivers, i.e., a $1^{st}$ receiver 510a, a $2^{nd}$ receiver 520b, through an $N^{th}$ receiver 510n (collectively "510"). In one embodiment, the $1^{st}$ through $N^{th}$ receiver 510 may each process a single signal from the signal generation unit 310 and provide the signal to the controller unit 140. In another embodiment, the may provide a plurality of signals to $1^{st}$ the through $N^{th}$ receiver 510. For example, the signal processing unit 130 may provide a signal receive signal for each receiver 510, or alternatively, a $1^{st}$ receiver signal for a first set of receivers 510 and a $2^{nd}$ receiver signal for a second set of receivers 510.

Figure 6:
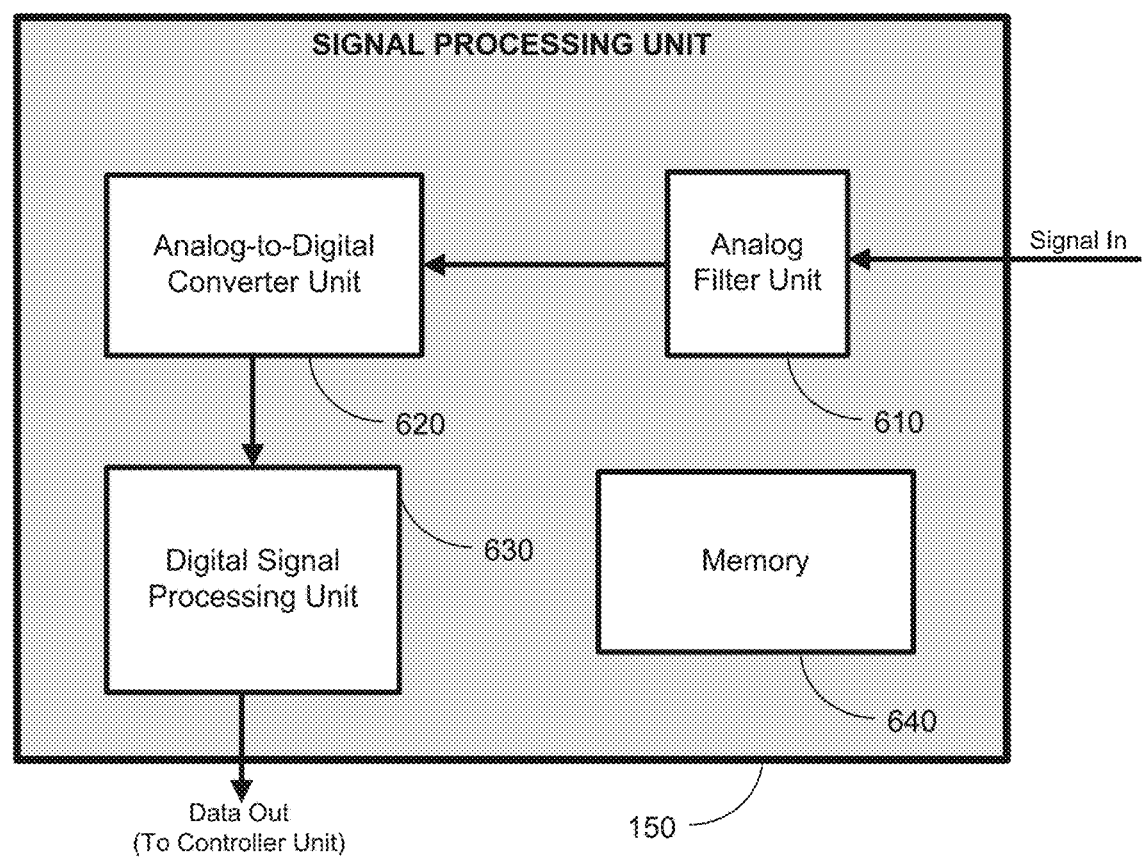
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog signal that had been down-converted from an mm-wave signal received by the signal processing unit 150. Noise filtering may be performed by the analog filter unit 610 prior to performing amplification of the analog signal that had been down-converted from an mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may be a of an accuracy of 12-bit, 24-bit, 36-bit, 48-bit, 64-bit, 96-bit, 128-bit, 256-bit, 512-bit, 1024-bit, or greater accuracy. The converted digital mm-wave signal is provided to the DSP unit 630.

The DSP unit 630 is capable of performing a variety of DSP operations on the digital mm-wave signal. For example, digital filtering of the digitized analog signal down-converted from mm-wave frequency may be performed by the DSP unit 630. As an example, signal components outside of a predetermined frequency range, e.g., 70 GHz to about 85 GHz may be filtered to be of lower amplitude. In other instances, mathematical functions, such as a Fast Fourier Transform (FFT) may be performed on the mm-wave signal. The processed digital output from the DSP unit 630 may be sent to the controller unit 140 for analysis. In other instances, the digital output may be buffered or stored into a memory 640. In some cases, the memory 610 may be a first-in-first-out (FIFO) memory. In other cases, the processed digital output from the DSP unit 630 may be stored in the memory unit 210 of the controller unit 140.

Figure 7:
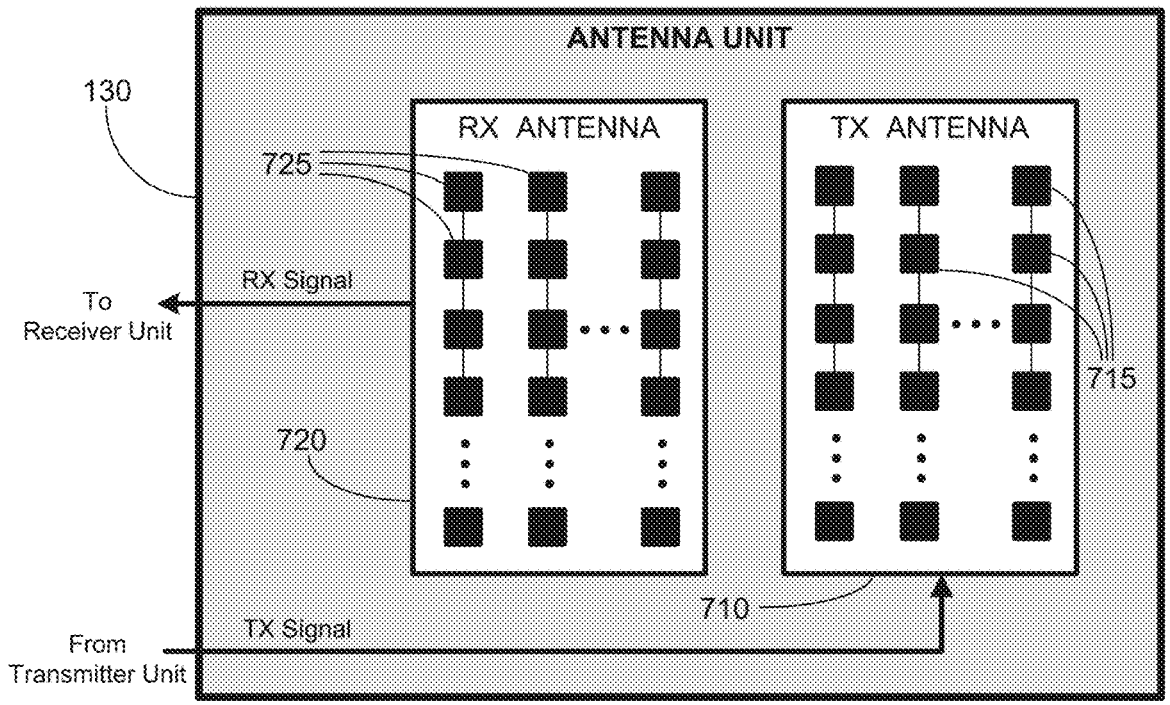
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., radar signals, network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., radar signals, network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 is also arranged in a predetermined pattern, e.g., an array matrix exemplified in FIG. 7.

Figure 8A:
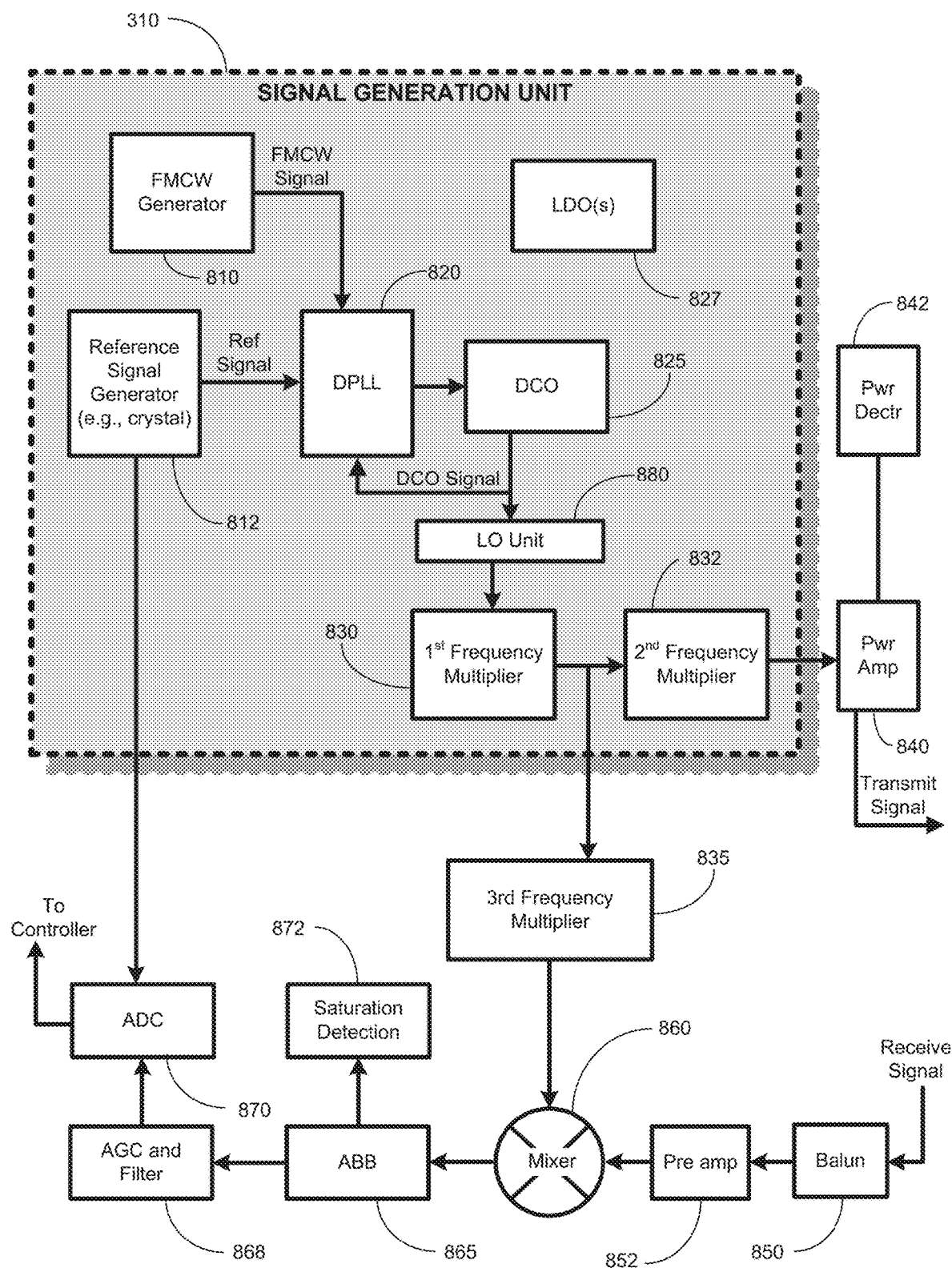
FIG. 8A illustrates a stylized block diagram depiction of an exemplary radar application of the system of FIG. 1, in accordance with an embodiment herein.
Figure 8B:
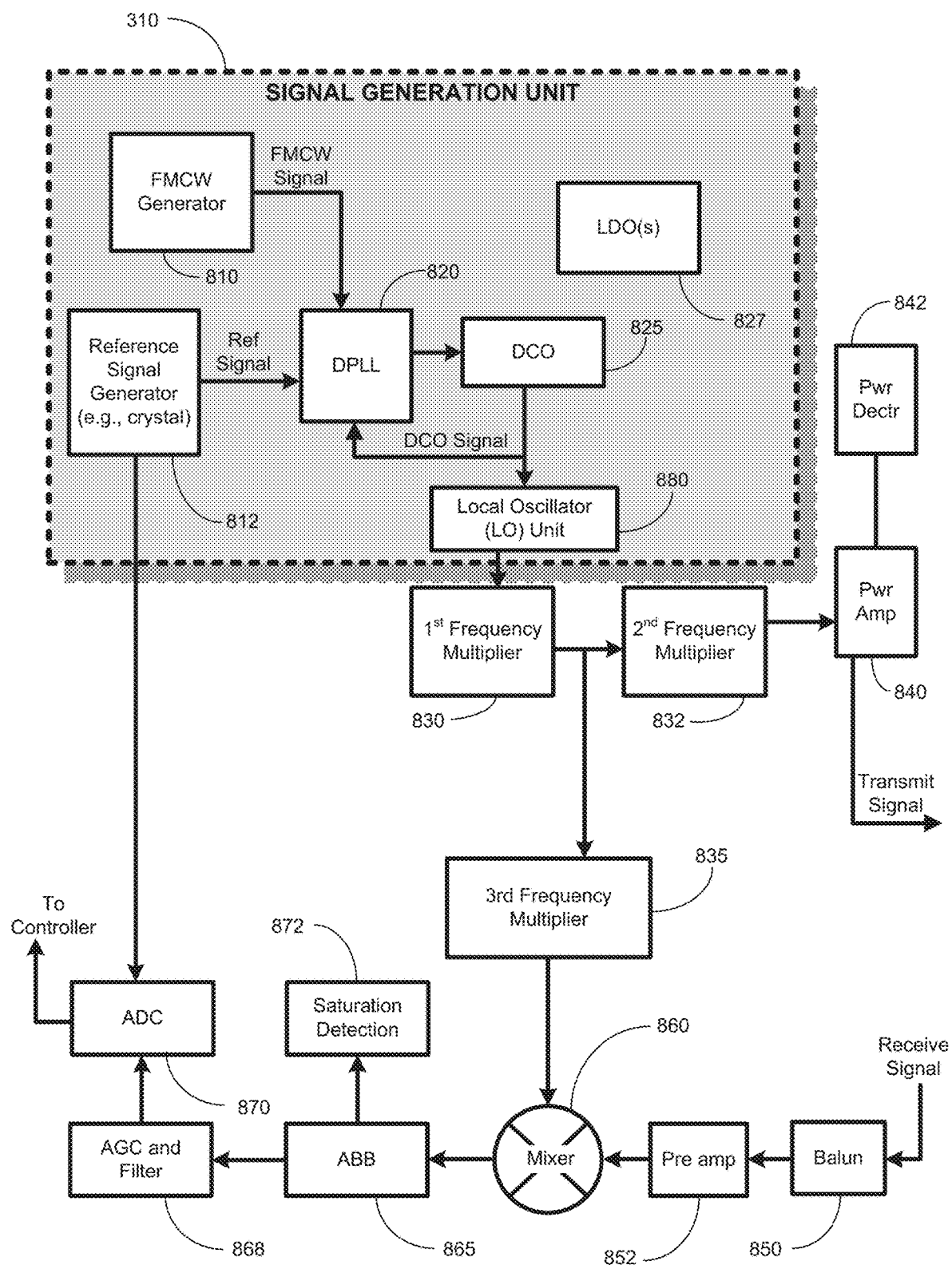
FIG. 8B illustrates a stylized block diagram depiction of an exemplary radar application of the system of FIG. 1, in accordance with another embodiment herein.

Turning now to FIG. 8A, a stylized block diagram depiction of an exemplary radar application of the system 100, in accordance with embodiments herein is illustrated. FIG. 8B illustrates a stylized block diagram depiction of an exemplary radar application of the system 100, in accordance with an alternative embodiment herein. FIGS. 8A and 8B show an exemplary implementation of the signal generation unit 310 (FIG. 3) and exemplary portions of the transmitter unit 320 and the receiver unit 330.

Referring simultaneously to FIGS. 8A and 9B, the signal generation unit 310 generates a signal (e.g., a radar signal) that is to be transmitted and directed to a target region, e.g., toward the area in front of a vehicle. A frequency modulated continuous wave (FMCW) generator 810 provides an mm-wave signal in the range of about 20 GHz. The FMCW generator 810 may be configured to provide a low sped ramp (LSR) signal or a high speed ramp (HSR) signal. In alternative embodiment, the FMCW generator 810 may be replaced by a pulse train generator for application of a Pulse Doppler radar system.

Further, a reference signal is provided by a reference signal generator 812. The mm-wave signal from the FMCW generator 810 and the reference signal are both sent to a digital phase lock loop (DPLL) 820. The DPLL 820 locks the phase of the mm-wave signal from the FMCW generator 810 with the phase of the reference signal. The output of the DPLL 820 is sent to a digitally controlled oscillator (DCO) 825. The output of the DCO is fed back to the DPLL. Thus, the DCO 825 is capable of providing a stable DCO signal. The DCO signal is, in one embodiment, is about 20 GHz.

A plurality of low dropout (LDO) regulators 827, which may comprise a reference voltage, an error amplifier a feedback voltage divider, and a plurality of pass elements, e.g., transistors. The LDO regulators 827 are configured to provide a regulated voltage supply to the various portions of the circuit of FIGS. 8A, 8B. Generally, this voltage supply is regulated voltage supply is lower than the supply voltage.

The signal generation unit 310 may also comprise one or more local oscillator (LO) units 880, which may receive the output from the DCO 825. The local oscillator unit 880 may be configured to provide an oscillator chain for distributing mm-wave signals to a plurality of transmitters and receivers. In some embodiments, the digitally controlled, phase-locked output mm-wave signal (i.e., output of the DCO 825) based on the FMCW signal and the reference signals may be provided by the local oscillator unit 880. The local oscillator unit 880 may provide mm-wave signals to the transmitter unit 320 for transmitting mm-wave signals, and/or to the receiver unit 330 to perform mixer functions. The local oscillator unit 880 may comprise a phase lock loop and a local oscillator distribution circuitry. As described below, the output of the LO 880 may be provided to one or more frequency multipliers.

In some embodiments, it is desirable to transmit an 80 GHz signal, for example in a vehicle radar application. The DCO 825 provides a 20 GHz signal, therefore, two frequency doublers may be used to multiply the 20 GHz signal to provide a 40 GHz, and then multiply the 40 GHz signal to provide an 80 GHz signal to transmit. Accordingly, a $1^{st}$ frequency multiplier 830 is used to double the 20 GHz signal to produce a 40 GHz signal. A $2^{nd}$ frequency multiplier 832 is used to double the 40 GHz signal to produce an 80 GHz signal. The output of the $2^{nd}$ frequency multiplier 832 is provided to a power amplifier 840. The output of the power amplifier 840 may be provided to the antenna for transmission. A power detector 842 may detect the power of the output of the power amp 840, and may prompt feedback adjustments in order to maintain a predetermined power level of the transmit signal.

A received signal may be processed by the circuit shown in FIGS. 8A, 8B. The received signal, e.g., from the signal processing unit 150, is provided to a balun circuit 850. The balun may comprise a transformer, and provides a differential output to a pre amp 852. After performing a pre amplification of the received signal, the output from the pre amp 852 is provided to the mixer 860.

The mixer 860 is capable of combining the received signal from the pre amp 852, with an output signal from a $3^{rd}$ frequency multiplier 835. The output of the $3^{rd}$ frequency multiplier 835 is the doubled version of the 40 GHz signal from the $1^{st}$ frequency multiplier. That is, the output of the $3^{rd}$ frequency multiplier 835 is an 80 GHz reference signal. The mixer 860 receives the reference 80 GHz signal and in one embodiment, multiplies it to the received signal, which is a reflected or echo signal resulting from the reflection from the transmitted signal. The mixer 860 may convert the received signal to a lower frequency signal (i.e., an analog baseband signal) using a signal from the LO 880 and via the $1^{st}$ and $3^{rd}$ frequency multipliers 830, 835. The output of the mixer 860 may be used to determine various characteristics regarding one or more objects from which the transmitted signal was reflected, including direction, location, trajectory, and/or speed of the object.

Each of the $1^{st}$, $2^{nd}$, and $3^{rd}$ frequency multipliers 830, 832, 835 may be a fully differential push-push frequency doubler. The frequency doubler employed by the frequency multipliers 830, 832, 835 is described in further details below.

The output of the mixer 860 is provided to an analog baseband (ABB) circuit 865. The ABB circuit 865 may comprise a trans-impedance amplifier, one or more filters (e.g., RC filters), and lower-frequency gain stages. The output of the ABB circuit 865 is provided to an automatic gain control (AGC) and filter circuits 868. A saturation detection circuit 872 may detect any saturation of the signal processed by the AGC/filter circuits 868 and perform responsive adjustment. The output of the AGC/filter circuits 868 is provided to an A/D converter 870. The output of the A/D converter 870 may be provided to the controller unit 140 for further processing (e.g., DSP stage) and responsive actions.

In alternative embodiment, the $1^{st}$, $2^{nd}$, and $3^{rd}$ frequency multipliers 830, 832, 835 may be outside the signal generation unit 310, but inside the radar front-end unit 120. This alternative embodiment is illustrated in FIG. 8B. Other portions of FIG. 8B are similar to FIG. 8A.

Figure 9:
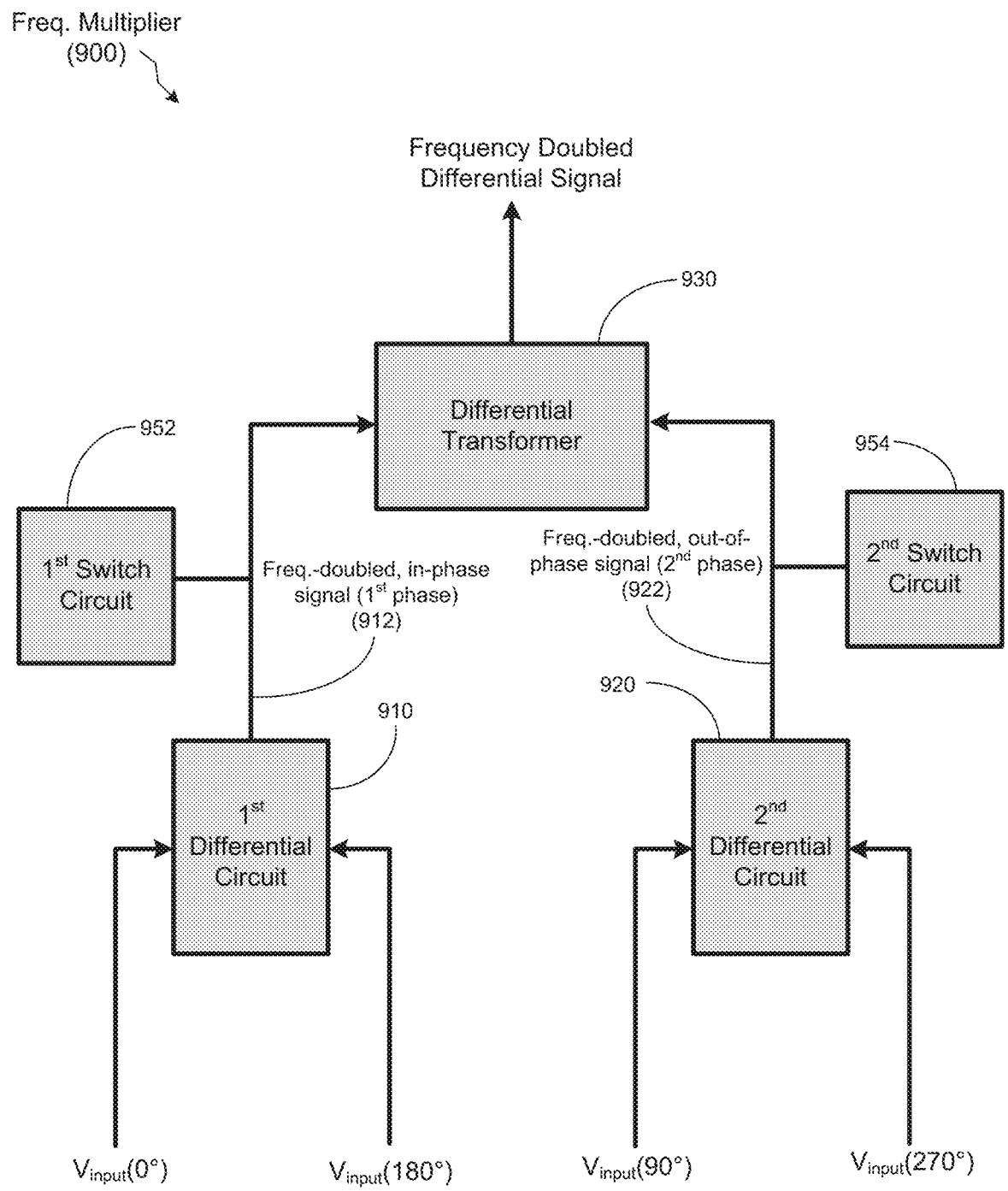
FIG. 9 illustrates a stylized block diagram description of an implementation of the frequency multiplier of embodiments herein.

Turning now to FIG. 9, a stylized block diagram description of an implementation of the frequency multiplier of embodiments herein, is illustrated. FIG. 9 illustrates a frequency multiplier 900 that provides a true differential output. In some embodiments, the frequency multiplier 900 may be implemented as the $1^{st}$, $2^{nd}$, and $3^{rd}$ frequency multipliers of FIGS. 8A, 8B.

The true differential output signal provided by the frequency multiplier 900 provides for accommodating large amplitude swings. Further, the true differential output of the frequency multiplier 900 provides improved isolation between the frequency multiplier 900 and other portions of an mm-wave circuit.

The frequency multiplier 900 is capable of utilizing a quad-phase input to provide a frequency multiplied, true differential output. That is, four phase-components of an input signal (i.e., 0° phase, 90° phase, 180° phase, and 270°) are provided as inputs in order to perform a frequency multiplication function, thereby providing a true differential, frequency-multiplied output signal. Accordingly, the frequency multiplier 900 is a quadrature FD circuit.

The frequency multiplier 900 comprises a $1^{st}$ differential circuit 910, which receives the 0° and 180° phase components of an input signal, $V_{input}$, i.e., $V_{input}(0°)$ and $V_{input}(180°)$, respectively. The output (912) of $1^{st}$ differential circuit (is doubled in frequency and is in-phase (912). The frequency multiplier 900 also comprises a $2^{nd}$ differential circuit 920, which receives the 90° phase and the 270° phase components of the input signal, i.e., $V_{input}(90°)$ and $V_{input}(270°)$, respectively. The output of $2^{nd}$ differential circuit is double in frequency and is out-of-phase (922) relative to the signal 912 by about 180°.

The operation of the $1^{st}$ differential circuit 910 may be controlled by the $1^{st}$ switch circuit 952, wherein the operation of the $2^{nd}$ differential circuit 920 may be controlled by the $2^{nd}$ switch circuit 954. A $1^{st}$ control signal is provided to the $1^{st}$ switch circuit 952 to activate or deactivate the $1^{st}$ differential circuit. Similarly, a $2^{nd}$ control signal is provided to the $2^{nd}$ switch circuit 954 to activate or deactivate the $2^{nd}$ differential circuit. In some embodiments, the circuit 900 may be implemented without using the $1^{st}$ and $2^{nd}$ switch circuits 952, 954.

The output of the $1^{st}$ and $2^{nd}$ differential circuits 910, 920, which are doubled in frequency and wherein a portion is in phase and another portion is out of phase provide a differential signal to a differential transformer 930. The output from the differential transformer 930 is a true differential, frequency-multiplied output signal, e.g., a frequency doubled, differential output signal. Further, the frequency-doubled, differential output signal has an amplitude that is twice or substantially higher than the amplitude of a signal that would be provided by a conventional frequency doubler.

The four phase components (e.g., $V_{input}(0°)$, $V_{input}(90°)$, $V_{input}(180°)$, and $V_{input}(270°)$) of input signal provided to the frequency multiplier may be generated by a variety of phase-shifting circuits. FIGS. 10, 11, 12A, and 12B provide exemplary phase-shifting circuits that may be utilized in embodiments herein.

Figure 10:
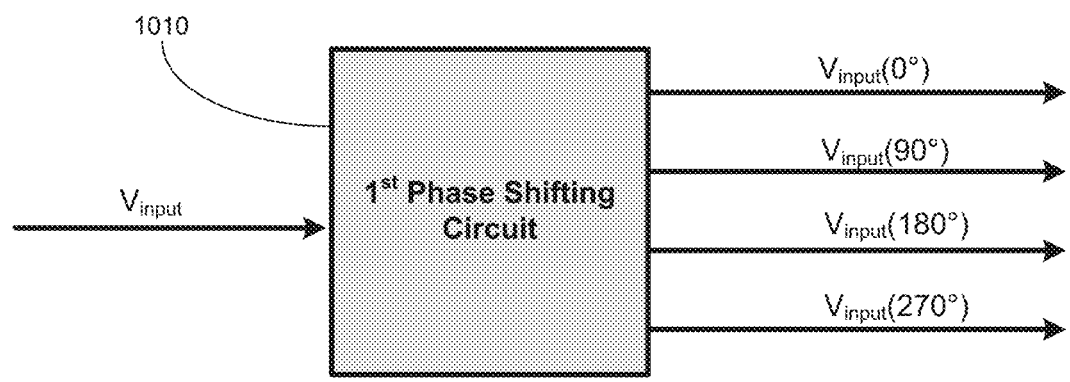
FIG. 10 illustrates a stylized block diagram representation of a $1^{st}$ phase shifting circuit, in accordance with a first embodiment.
Figure 11:
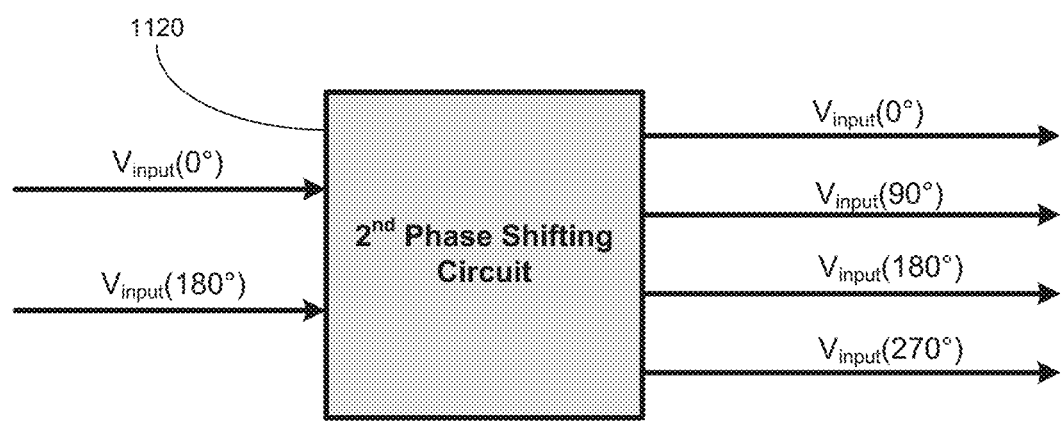
FIG. 11 illustrates a stylized block diagram representation of a $2^{nd}$ phase shifting circuit, in accordance with a second embodiment.
Figure 12A:
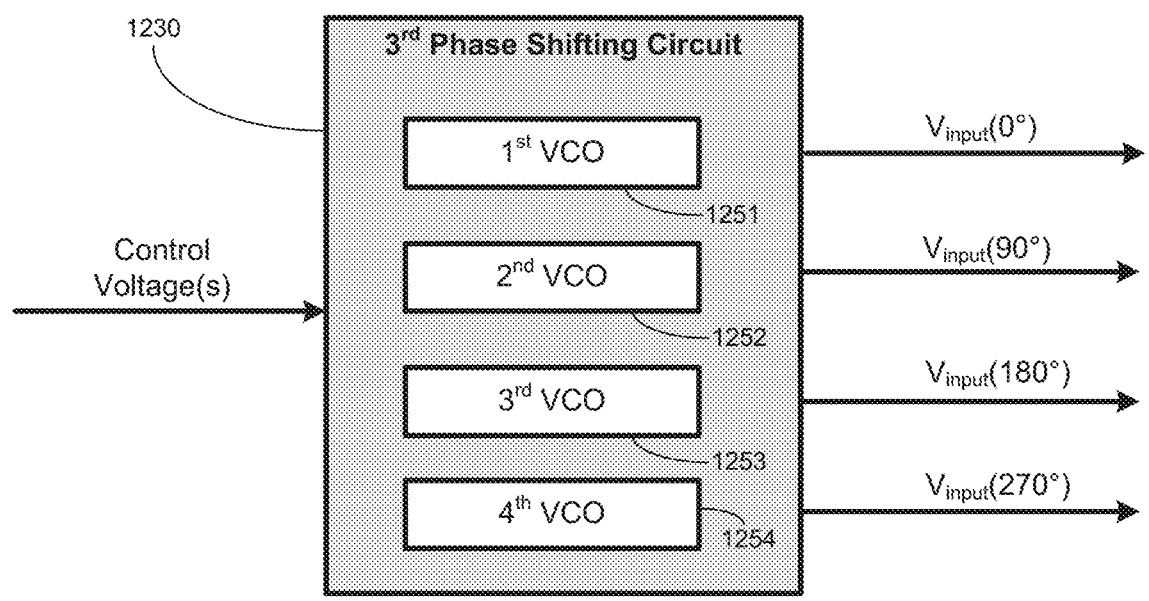
FIG. 12A illustrates a stylized block diagram representation of a $3^{rd}$ phase shifting circuit, in accordance with a third embodiment.
Figure 12B:
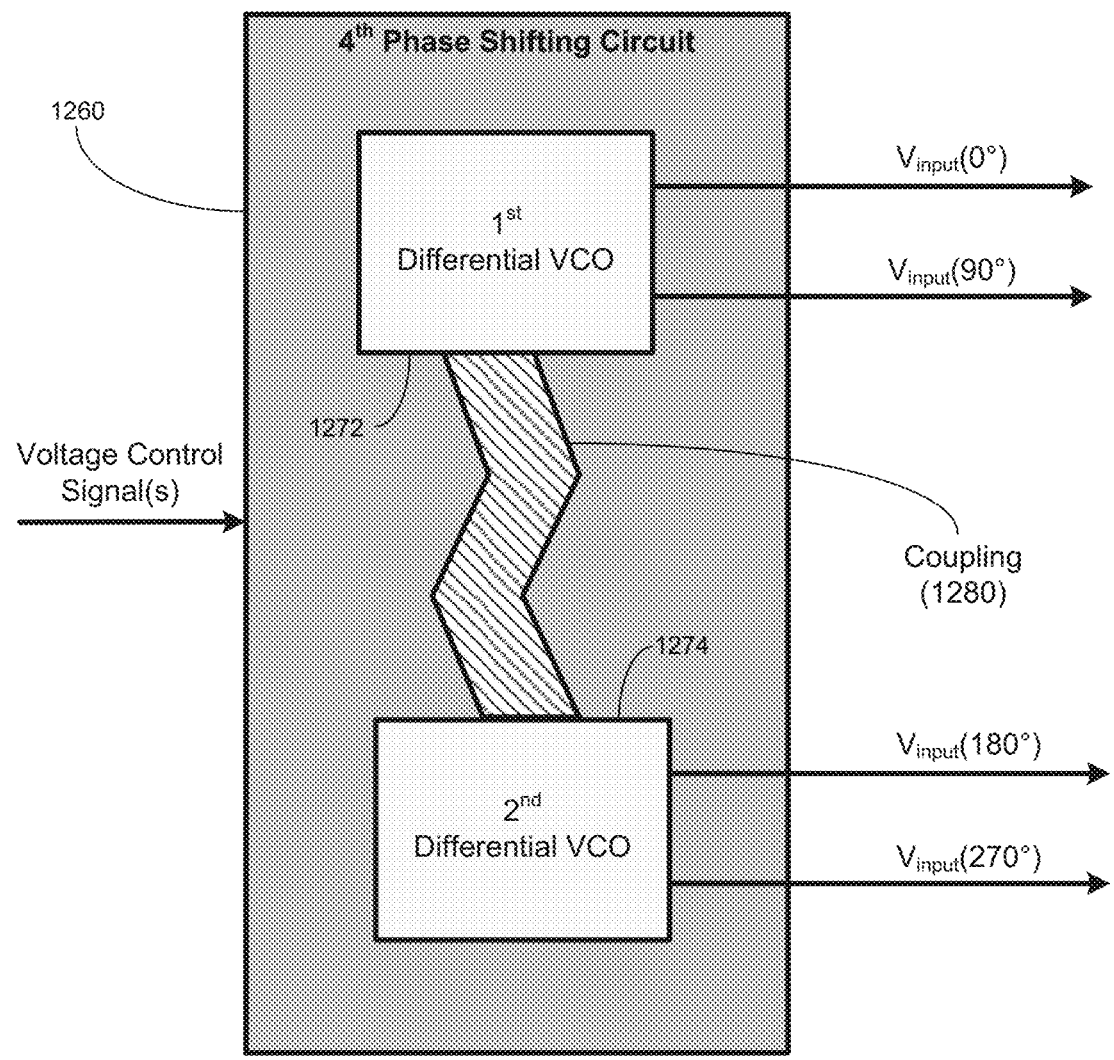
FIG. 12B illustrates a stylized block diagram representation of a $4^{th}$ phase shifting circuit, in accordance with a fourth embodiment.

FIG. 10 illustrates a stylized block diagram representation of a $1^{st}$ phase shifting circuit 1010, in accordance with a first embodiment. FIG. 11 illustrates a stylized block diagram representation of a $2^{nd}$ phase shifting circuit 1120, in accordance with a second embodiment. FIG. 12A illustrates a stylized block diagram representation of a $3^{rd}$ phase shifting circuit 1230, in accordance with a third embodiment. FIG. 12B illustrates a stylized block diagram representation of a $4^{th}$ phase shifting circuit 1240, in accordance with a fourth embodiment. The outputs from the phase shifting circuits are sent to the frequency multiplier 900.

The $1^{st}$ phase shifting circuit 1010 (FIG. 10) receives an input voltage, $V_{input}$, and performs phase shifting of $V_{input}$ to generate four signals of four phase components, $V_{input}(0°)$, $V_{input}(90°)$, $V_{input}(180°)$, and $V_{input}(270°)$. The phase shifting circuit 1010 may implement a circuitry (e.g., a circuit that includes inverters, buffers, etc.). in order to perform the phase shifting of the input voltage signal, $V_{input}$.

The $2^{nd}$ phase shifting circuit 1120 (FIG. 11) receives two input signals, a 0° phase input signal, $V_{input}(0°)$ and a 180° phase input signal, $V_{input}(180°)$. The $2^{nd}$ phase shifting circuit 1120 implements circuitry to generate a 90° phase input signal, $V_{input}(90°)$ from $V_{input}(0°)$ by shifting it by 90°, and a 270° phase input signal, $V_{input}(270°)$ from $V_{input}(180°)$ by shifting it 90°.

The $3^{rd}$ phase shifting circuit 1230 (FIG. 12A) implements a plurality of voltage controlled oscillators (VCOs) to generate signals of four phases, $V_{input}(0°)$, $V_{input}(90°)$, $V_{input}(180°)$, and $V_{input}(270°)$. One or more control voltage signals are provided to the $3^{rd}$ phase shifting circuit 1230. The control voltage signal(s) are used to control the operation of a $1^{st}$ VCO 1251, a $2^{nd}$ VCO 1252, a $3^{rd}$ VCO 1253, and a $4^{th}$ VCO 1254. The $1^{st}$ VCO 1251 generates $V_{input}(0°)$, the $2^{nd}$ VCO 1252 generates $V_{input}(90°)$, the $3^{rd}$ VCO 1253 generates $V_{input}(180°)$, and the $4^{th}$ VCO generates $V_{input}(270°)$. The $V_{input}(0°)$, $V_{input}(90°)$, $V_{input}(180°)$, and $V_{input}(270°)$ signals are provided to the frequency multiplier 900.

The $4^{th}$ phase shifting circuit 1240 (FIG. 12B) comprises a $1^{st}$ differential VCO 1262 and a $2^{nd}$ differential VCO 1264 to generate signals of four phases, $V_{input}(0°)$, $V_{input}(90°)$, $V_{input}(180°)$, $V_{input}(270°)$. The $1^{st}$ differential VCO 1262 generates the zero phase and the 180° phase signals, $V_{input}(0°)$ and $V_{input}(180°)$ respectively on each differential output node. The $2^{nd}$ differential VCO 1264 generates the 180° and 270° phase signals, $V_{input}(180°)$ and $V_{input}(270°)$ respectively on each differential output node.

The $1^{st}$ and $2^{nd}$ differential VCOs 1262, 1264 may be connected by a coupling connection 1280. The coupling 1280 allows for the $1^{st}$ and $2^{nd}$ differential VCOs 1262, 1264 to be synced with each other to provide output signals that have coordinated phase differences. The $1^{st}$ and $2^{nd}$ differential VCOs 1262, 1264, respectively on each differential node 1262, 1264, are capable of providing signals having varying phases and similar frequencies, e.g., mmwave frequency signals. Further, one or more voltage control signals are provided to the $4^{th}$ phase shifting circuit 1240. The control voltage signal(s) are used to control the operation of the $1^{st}$ and $2^{nd}$ differential VCOs. The $V_{input}(0°)$, $V_{input}(90°)$, $V_{input}(180°)$, and $V_{input}(270°)$ signals are provided to the frequency multiplier 900.

Figure 13:
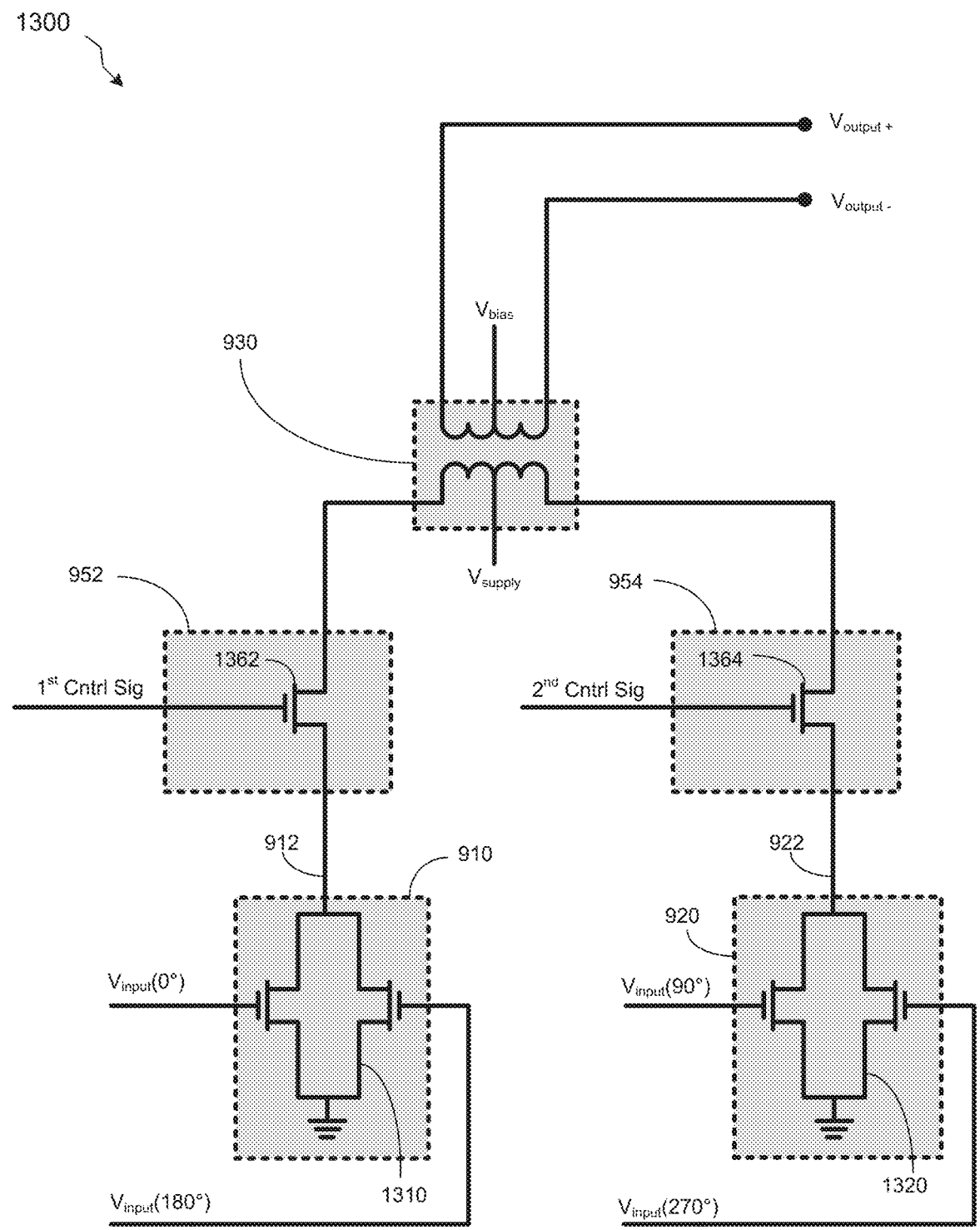
FIG. 13 illustrates a stylized depiction of a circuit implementation of the frequency multiplier of FIG. 9, in accordance with one embodiment herein, is illustrated.

Turning now to FIG. 13, a stylized depiction of a circuit implementation of the frequency multiplier of FIG. 9, in accordance with one embodiment herein, is illustrated. FIG. 13 shows a quadrature FD circuit 1300, in accordance with some embodiments herein.

The $1^{st}$ differential circuit 910 may include a $1^{st}$ differential transistor pair 1310. The 0° and 180° phase input signals $V_{input}(0°)$ and $V_{input}(180°)$, are connected to respective gate nodes of the transistor pair 1310. The source nodes of the transistor pair 1310 are coupled to ground. The drain nodes of the transistor pair 1310 are connected to the source node of a $1^{st}$ control transistor 1362, which if activated, allows the combination of differential components $V_{input}(0°)$ and $V_{input}(180°)$ to pass to a first input node of the primary windings of the differential transformer 930. The $1^{st}$ control transistor 1362 is turned on by the $1^{st}$ control signal, which may be a voltage signal. This circuit 910 provides a frequency-doubled output that is in phase ($1^{st}$ phase).

The $2^{nd}$ differential circuit 910 may include a $2^{nd}$ differential transistor pair 1320. The 90° and 270° phase input signals input signals $V_{input}(90°)$ and $V_{input}(270°)$, are connected to respective gate nodes of the transistor pair 1320. The drain nodes of the transistor pair 1320 are connected to the source node of a $2^{nd}$ control transistor 1364, which if activated, allows the combination of differential components $V_{input}(90°)$ and $V_{input}(270°)$, to pass to a $2^{nd}$ node of the primary windings of the differential transformer 930. The $2^{nd}$ control transistor 1364 is turned on by the signal $2^{nd}$ control signal, which may be a voltage signal. In one embodiment, the $1^{st}$ and $2^{nd}$ control signals may be provided by the controller unit 140. In this manner, the combination of the $V_{input}(90°)$ and $V_{input}(270°)$ is provided to a $2^{nd}$ input node of the differential transformer 930. The circuit 920 provides a frequency doubled output that is in out of phase (i.e., a $2^{nd}$ phase that is 180° out of phase relative to the $1^{st}$ phase). Based on the four components of the input signal, i.e., $V_{input}(0°)$, $V_{input}(90°)$, $V_{input}(180°)$, and $V_{input}(270°)$, the differential transformer 930 is capable of providing a true differential output signal $V_{output}$ that is twice the frequency of the input signal. The differential transformer 930 comprises a voltage supply node on its primary windings for receiving a supply voltage $V_{supply}$, and a bias voltage node on its secondary windings for receiving a bias voltage signal $V_{bias}$. The values of the supply voltage $V_{supply}$ and the bias $V_{bias}$ voltage are predetermined in one embodiment, or may be dynamically adjusted to provide desired amplitude for the frequency-doubled, fully differential output signal, $V_{output+}$, $V_{output-}$.

Figure 14:
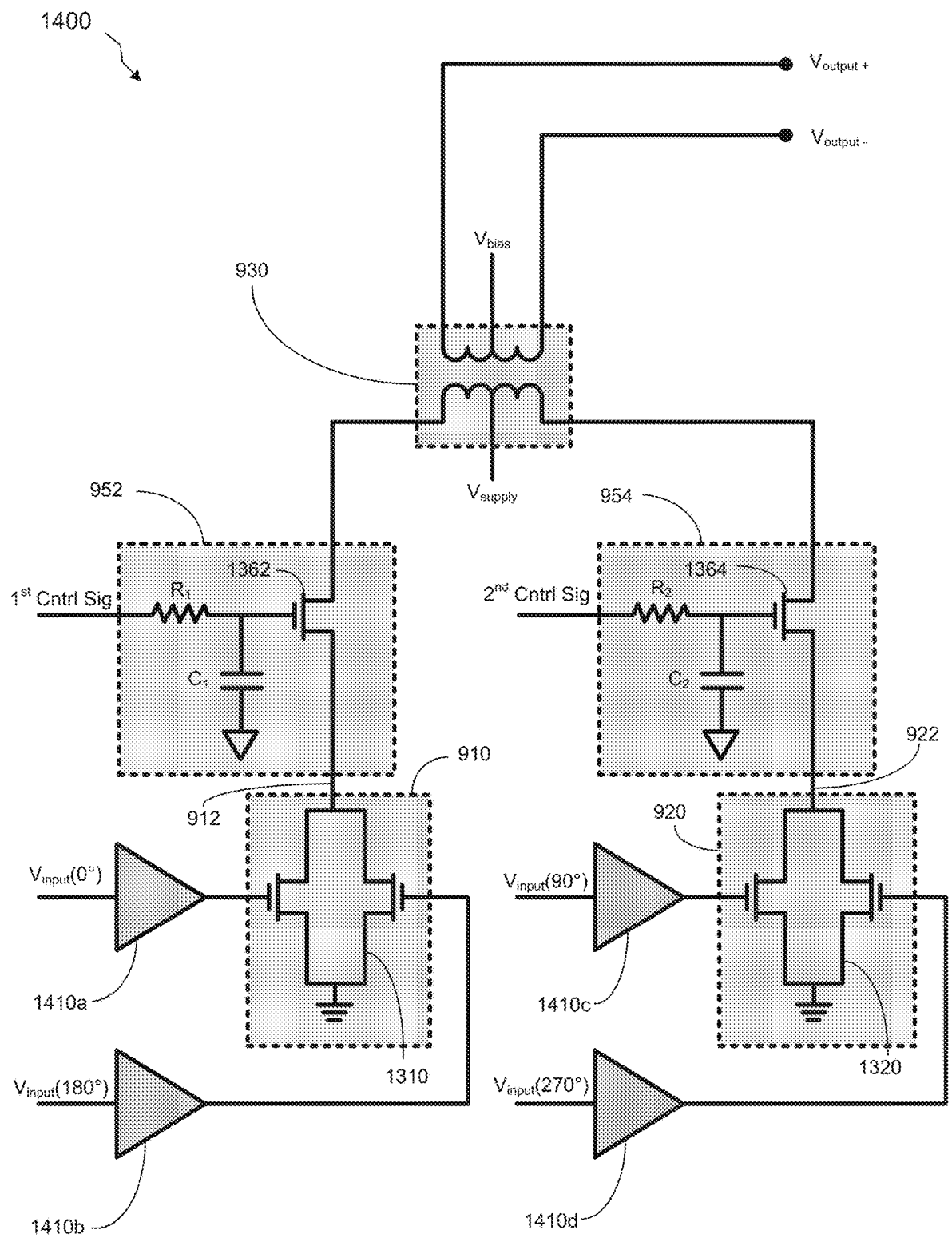
FIG. 14 illustrates a stylized depiction of a circuit implementation of the frequency multiplier of FIG. 9, in accordance with a second embodiment herein.

FIG. 14 illustrates a stylized depiction of a circuit implementation of the frequency multiplier of FIG. 9, in accordance with a second embodiment herein. The circuit illustrated in FIG. 14 operates in a similar fashion as the circuit described with respect to FIG. 13. However, FIG. 14 illustrates a $1^{st}$ buffer 1410a and a $2^{nd}$ buffer 1410b respectively connected to the gates of the $1^{st}$ differential pair 1310. Similarly, a $3^{rd}$ buffer 1410c and a $4^{th}$ buffer 1410d respectively connected to the gates of the $2^{nd}$ differential pair 1320.

Each of the buffers 1410(a-d) may represent a more complex circuit, such as a signal conditioning circuit that is capable of performing a plurality of functions, e.g., buffer amplifier function, fine-adjustment of the phase of the input signal, signal-drive increase, etc. In one embodiment, the lower frequency input signals $V_{input}$ may be of lower power. As such, the buffers 1410(a-d) may be designed to increase the drive of the input signals to a predetermined level.

In some embodiments, the buffers 1410(a-d) may adjust the phase of the input signals. The phase of the input signal portions $V_{input}(0°)$, $V_{input}(90°)$, $V_{input}(180°)$, and $V_{input}(270°)$ may be independently adjusted to provide synced quadrature inputs to the quadrature FD circuit 1400. Using the buffers 1410(a-d), the amplitude and frequency response of the output signal $V_{output}$ of the quadrature FD circuit 1400 may be adjusted to desired specifications.

Further, the $1^{st}$ and $2^{nd}$ switch circuits 952 each may comprise an RC circuit connected to the $1^{st}$ and $2^{nd}$ control transistors 1362, 1364. A resistor R1 in series with a capacitor C1 are connected to the gate of the $1^{st}$ control transistor 1362. The $1^{st}$ control signal is provided to a first node of the resistor R1, wherein the other node of R1 is connected to a $1^{st}$ node of the capacitor C1, whose $2^{nd}$ node is connected ground.

Similarly, a resistor R2 in series with a capacitor C2 are coupled to the $2^{nd}$ control transistor 1364. The $2^{nd}$ control signal is provided to a first node of the resistor R2, wherein the other node of R2 is connected to a $1^{st}$ node of the capacitor C2, whose $2^{nd}$ node is connected ground. The RC circuits provide for timing adjustments of the operation of the $1^{st}$ and $2^{nd}$ switch circuits 952, 954. The RC circuits may also provide filtering capabilities. The combination of the $V_{input}(0°)$ and $V_{input}(180°)$ is provided to a $1^{st}$ input node of the differential transformer 930. The combination of the $V_{input}(90°)$ and $V_{input}(270°)$ is provided to a 2$^{nd}$ input node of the differential transformer 930. The transformer 930 provides a frequency-doubled, fully differential output signal ($V_{output+}$, $V_{output-}$) representing the doubled frequency signal described above.

Figure 15:
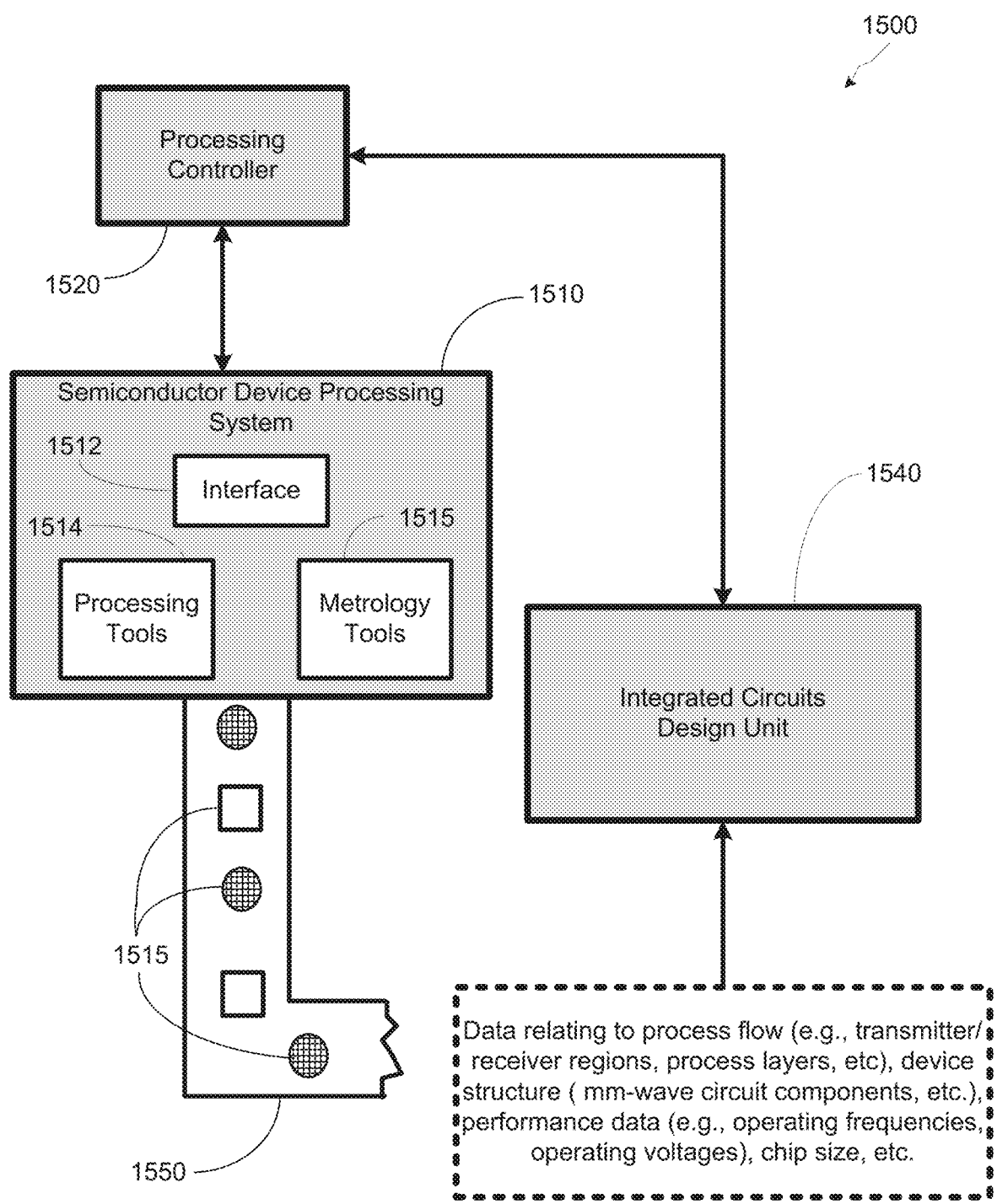
FIG. 15 illustrates a stylized depiction of a system for fabricating a semiconductor device, in accordance with embodiments herein.

Turning now to FIG. 15, a stylized depiction of a system for fabricating a semiconductor device having an integrated circuit, in accordance with embodiments herein, is illustrated. The system 1500 provides for forming an integrated circuit having the features described above with regard to FIGS. 1-14.

The system 1500 of FIG. 15 may comprise a semiconductor device processing system 1510 and a design unit 1540. The semiconductor device processing system 1510 may manufacture integrated circuit devices based upon one or more designs provided by the design unit 1540.

The semiconductor device processing system 1510 may comprise various processing stations, such as deposition (e.g., ALD, PECVD, etc.) stations, etch process stations, photolithography process stations, CMP process stations, etc. One or more of the processing steps performed by the processing system 1510 may be controlled by the processing controller 1520. The processing controller 1520 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1510 may produce integrated circuits on a medium, such as silicon wafers. More particularly, the semiconductor device processing system 1510 produce integrated circuits having a truly differential FD circuit capable of performing doubling of the frequency of an mm-wave signal. The semiconductor device processing system 1510 provides for forming a quadrature FD circuit implemented as a differential, push-push configuration FD circuit.

The production of integrated circuits by the device processing system 1510 may be based upon the circuit designs provided by the integrated circuits design unit 1540. The processing system 1510 may provide processed integrated circuits/devices 1515 on a transport mechanism 1550, such as a conveyor system. In some embodiments, the transport system may be sophisticated clean room transport systems that are capable of transporting semiconductor wafers. In one embodiment, the semiconductor device processing system 1510 may comprise a plurality of processing steps to perform deposition of material comprising intrinsic stress into gate cut regions.

In some embodiments, the items labeled "1515" may represent individual wafers, and in other embodiments, the items 1515 may represent a group of semiconductor wafers, e.g., a "lot" of semiconductor wafers. The integrated circuit or device 1515 may be a transistor, a capacitor, a resistor, a memory cell, a processor, and/or the like.

The integrated circuit design unit 1540 of the system 1500 is capable of providing a circuit design that may be used by the semiconductor processing system 1510 to manufacture mm-wave devices described herein.

The system 1500 may be capable of performing analysis and manufacturing of various products involving various technologies. For example, the system 1500 may design and production data for manufacturing devices of CMOS technology, Flash technology, BiCMOS technology, and/or various other semiconductor technologies.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the disclosure. Accordingly, the protection sought herein is as set forth in the claims below.

What is claimed is:

1. An apparatus, comprising:
a first differential circuit configured to receive a 0° phase component of an input signal at a first input of the first differential circuit and a 180° phase component of said input signal at a second input of the first differential circuit, and providing a first output signal based only on said 0° and said 180° phase components of said input signal;
a second differential circuit configured to receive a 90° phase component of said input signal at a first input of the second differential circuit and a 270° phase component of said input signal at a second input of the second differential circuit, and providing a second_output signal based only on said 90° and said 270° phase components of said input signal, wherein said input signal has a first frequency;
a differential transformer configured to receive said first output signal at a first node and receive said second output signal at a second node, wherein said differential transformer is configured to provide a differential output signal that has a second frequency that is twice the first frequency;
a first switch circuit operatively coupled to said first differential circuit for turning on or turning off said first differential circuit and
a second switch circuit operatively coupled to said second differential circuit for turning on or turning off said second differential circuit.

2. The apparatus of claim 1, wherein:
said first input of said first differential circuit is a gate node of a first transistor;
said second input of said first differential circuit is a gate node of a second transistor;
said first input of said second differential circuit is a gate node of a third transistor;
said second input of said second differential circuit is a gate node of a fourth transistor;

said first output of said first differential circuit is operatively coupled to the drain nodes of the first and second transistors;

said second output of said second differential circuit is operatively coupled to the drain nodes of the third and fourth transistors;

said first output signal has a frequency that is about twice the frequency of said first and input signal and has a first phase; and said second output signal has a frequency that is about twice the frequency of said input signal and has a second phase that is 180° out of phase from said first phase.

3. The apparatus of claim 1, wherein said differential transformer comprises a voltage supply node on a primary winding of said transformer, and a bias voltage node on a secondary winding of said transformer, wherein the amplitude of said differential output signal is controlled by at least one of a voltage on the voltage supply node, or a voltage on said bias voltage node.

4. The apparatus of claim 1, wherein said first frequency is a frequency between a range of about 10 GHz to about 40 GHz.

5. The apparatus of claim 1, wherein said differential output signal is a millimeter wavelength signal.

6. The apparatus of claim 1, further comprising:
a first input buffer coupled to said first input of said first differential circuit, said first input buffer configured to perform at least one of amplifying, driving, or phase-adjusting said 0° phase component of said input signal;
a second input buffer coupled to said second input of said first differential circuit, said second input buffer configured to perform at least one of amplifying, driving, or phase-adjusting said 180° phase component of said input signal;
a third input buffer coupled to said first input of said second differential circuit, said third input buffer configured to perform at least one of amplifying, driving, or phase-adjusting said 90° phase component of said input signal; and
a fourth input buffer coupled to said second input of said second differential circuit, said fourth input buffer configured to perform at least one of amplifying, driving, or phase-adjusting said 270° phase component of said input signal.

7. The apparatus of claim 1, further comprising at least one of:
a first phase shifting circuit configured to receive a first signal and generate said 0°, 90°, 180°, and 270° phase components of said input signal from said first signal;
a second phase shifting circuit configured to receive a 0° and 180° phase components of said input signal and provide said 0°, 90°, 180°, and 270° phase components of said input signal;
a third phase shifting circuit configured to receive a voltage control signal and based on said voltage control signal, generate:
said 0° phase component using a first voltage control oscillator (VCO);
said 90° phase component using a second VCO;
said 180° phase component using a third VCO; and
said 270° phase component using a fourth VCO; or
a fourth phase shifting circuit configured to receive a voltage control signal, and based on said voltage control signal, generate:
said 0° and 90° phase components using a first differential VCO; and
said 180° and 270° phase components using a second differential VCO.

8. An apparatus, comprising:
a radar unit;
a signal processing unit operatively coupled to said radar unit configured to provide an outgoing signal to said radar unit for transmission and an incoming signal to said radar unit;
wherein said radar unit comprises a signal generation unit comprising a frequency multiplier comprising:
a first differential circuit configured to receive a 0° phase input signal having a first frequency at a first input of the first differential circuit and a 180° phase input signal having said first frequency at a second input of the first differential circuit, and providing a first output signal that is twice the first frequency, has a first phase, and is based only on said 0° and said 180° input signals;
a second differential circuit configured to receive a 90° phase input signal having said first frequency at a first input of the second differential circuit and a 270° phase input signal having said first frequency at a second input of the second differential circuit, and providing a second output signal that is twice the first frequency, has a second phase that is 180° out of phase from the first phase, and is based only on said 90° and said 270° phase input signals;
a differential transformer configured to receive said first output signal at a first node and receive said second output signal at a second node, wherein said differential transformer is configured to provide a differential output signal that has a second frequency that is twice the first frequency;
a frequency modulated continuous wave (FMCW) generator configured to generate a first mm-wave signal;
a phase lock loop (PLL) for receiving said first mm-wave signal and generating a second mm-wave signal;
a digitally controlled oscillator for receiving said second mm-wave signal and generating a third mm-wave signal;
a phase shifting circuit to receive said third mm-wave signal and to generate said 0°, 90°, 180°, and 270° input signals based on the third mm-wave signal; and
a local oscillator for distributing said input signals.

9. The apparatus of claim 8, wherein said signal generation unit comprises a signal generator for generating said input signal, wherein said signal generation unit is configured to generate a signal having a frequency in the range of about 10 GHz to about 40 GHz.

10. The apparatus of claim 8, wherein said radar unit comprises:
a transmitter unit operatively coupled to said signal generating unit, wherein said transmitter unit is configured to generate a millimeter wave (mm-wave) transmit signal; and
a receiver unit to receive an mm-wave receive signal.

11. The apparatus of claim 10, wherein said radar unit further comprising a mixer configured to mix said mm-wave receive signal with said output signal for determining at least one of a direction, location, or speed of an object.

12. The apparatus of claim 8, further comprising:
an antenna unit for transmitting said outgoing signal and receiving said incoming signal; and
a controller unit configured to control an operation of at least one of said radar unit, said signal processing unit, and said antenna unit, wherein said controller unit is configured to provide data based on at least one of a direction, location, or speed of an object to control an operation of a vehicle.

13. The apparatus of claim 8, further comprising a second frequency multiplier coupled to said first frequency multiplier, said second frequency multiplier configured to generate a differential output signal that has a third frequency that is four times the first frequency.

14. An integrated circuit chip, comprising:
- a radar circuit;
- a signal processing unit operatively coupled to said radar circuit configured to provide an outgoing signal to said radar unit for transmission and an incoming signal to said radar unit;
- an antenna unit for transmitting said outgoing signal and receiving said incoming signal; and
- a controller unit to control an operation of at least one of said radar unit, said signal processing unit, and said antenna unit;
- wherein said radar circuit comprises a signal generation unit comprising a first frequency multiplier comprising:
- a first differential circuit configured to receive a 0° phase input signal at a first input of the first differential circuit and a 180° phase input signal at a second input of the first differential circuit, and providing a first output signal based only on said 0° and said 180° input signals;
- a second differential circuit configured to receive a 90° phase input signal at a first input of the second differential circuit and a 270° phase input signal at a second input of the second differential circuit, and providing a second output signal based only on said 90° and said 270° phase input signals, wherein said input signals has a first frequency; and
- a differential transformer configured to receive said first output signal at a first node and receive said second output signal at a second node, wherein said differential transformer is configured to provide a first differential output signal that has a frequency that is twice the first frequency; and wherein said radar circuit further comprises:
- a frequency modulated continuous wave (FMCW) generator configured to generate a first mm-wave signal;
- a phase lock loop (PLL) for receiving said first mm-wave signal and generating a second mm-wave signal;
- a digitally controlled oscillator for receiving said second mm-wave signal and generating a third mm-wave signal;
- a phase shifting circuit to receive said third mm-wave signal and to generate said 0°, 90°, 180°, and 270° input signals based on the third mm-wave signal;
- a second frequency multiplier to receive said differential output signal and generate a second differential output signal having a third frequency that is twice the second frequency; and
- a power amplifier for providing said outgoing signal based on said second differential output signal.

15. The integrated circuit chip of claim 14, further comprising an antenna unit for transmitting said outgoing signal and receiving said incoming signal.

16. The integrated circuit chip of claim 14, wherein said controller comprises:
- a processor for executing a plurality of instructions;
- a memory unit for storing data and said instructions; and
- a logic unit for performing a plurality of logic functions;
- wherein said controller is configured to provide data based on said at least one of a direction, location, or speed of an object to control an operation of a vehicle based upon said incoming signal.

17. The integrated circuit chip of claim 14, wherein said radar circuit further comprises:
- a balun circuit configured to receive said incoming signal;
- a mixer configured to mix a millimeter waver (mm-wave) signal with said incoming signal from said balun circuit for determining at least one of a direction, location, or speed of an object;
- an analog baseband (ABB) circuit for receiving an output signal from said mixer; and
- an analog-to-digital converter (ADC) configured to convert said ABB circuit to a digital format.

* * * * *